US006904585B2

United States Patent
Brittain et al.

(10) Patent No.: US 6,904,585 B2
(45) Date of Patent: Jun. 7, 2005

(54) METHOD FOR IDENTIFICATION AND REMOVAL OF NON-TIMING CRITICAL WIRE ROUTES FROM CONGESTION REGION

(75) Inventors: Mark A. Brittain, Pflugerville, TX (US); Kenneth D. Klapproth, Austin, TX (US); Vu T. Le, Poughkeepsie, NY (US); Joseph J. Palumbo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/408,206

(22) Filed: Apr. 4, 2003

(65) Prior Publication Data

US 2004/0199884 A1 Oct. 7, 2004

(51) Int. Cl.[7] .............................................. G06F 17/50
(52) U.S. Cl. .............................. 716/13; 716/12; 716/14; 716/5
(58) Field of Search ......................... 716/2, 4–6, 8–14; 326/93, 101

(56) References Cited

U.S. PATENT DOCUMENTS 6,205,571 B1 * 3/2001 Camporese et al. ........... 716/2
6,205,572 B1 * 3/2001 Dupenloup ..................... 716/5
6,577,165 B1 * 6/2003 Cheung et al. ................ 326/93
6,701,507 B1 * 3/2004 Srinivasan .................... 716/10

* cited by examiner

Primary Examiner—Vuthe Siek
(74) Attorney, Agent, or Firm—Lynn A. Augspurger

(57) ABSTRACT

A method for identifying and modifying, in a VLSI chip design, wire routes within a region of wiring congestion that can be routed around that region without inducing timing violations by the insertion and proper placement of inverters. Circuits and nets are examined in the vicinity of the wiring congestion to determine those nets with high potential to drive a route outside the region. Circuit locations are analyzed to determine if the net connecting them creates a path through the region of wiring congestion. Timing slacks are derived from the timing reports for such nets and compared against a timing value representing the additional delay of using an inverter pair to drive the wire route outside the region of wiring congestion. If a net has sufficient timing slack, it is buffered with an inverter pair which is then placed in a manner as to force the wire routes for the modified path around the region of wiring congestion, thereby reducing the wire utilization within the region.

9 Claims, 4 Drawing Sheets

US 6,904,585 B2

METHOD FOR IDENTIFICATION AND REMOVAL OF NON-TIMING CRITICAL WIRE ROUTES FROM CONGESTION REGION

FIELD OF THE INVENTION

This invention relates to the physical design process of designing VLSI semiconductor chips, and particularly directed at the alleviation of wiring congestion and its relationship to timing.

Trademarks: IBM® is a registered trademark of International Business Machines Corporation, Armonk, N.Y., U.S.A. S/390, Z900 and z990 and other product names may be registered trademarks or product names of International Business Machines Corporation or other companies.

BACKGROUND

Wiring congestion in an area of a semiconductor chip leads to non-steiner wire lengths and possibly unwireable nets. Non-steiner wire lengths impede the process of timing closure as each pass of routing can result in different nets seeing increased wire load, thus leading to a different set of circuit paths which may need to be optimized to meet timing requirements.

Arbitrarily replacing the region to spread out circuits may relieve wiring congestion, but at the expense of timing as there is greater distance between the circuits. U.S. Pat. No. 5,218,551, "Timing Driven Placement", describes a method of circuit placement which considers both timing and wiring congestion. Although this has the desired effect of prioritizing the placement of a timing critical circuit, the leverage of keeping a non-timing critical circuit outside a wiring congestion region is limited in that no circuit optimization or buffering is performed. U.S. Pat. No. 6,080,201, "Integrated Placement and Synthesis for Timing Closure of Microprocessors", goes a step further by modifying the circuit implementation, or re-synthesizing, based on placement information and timing constraints. Although the placement algorithm inherently has wiring congestion as a metric, the re-synthesizing process is driven primarily by timing constraints as well as power and area reduction. Circuit buffering or repowering is not done with the intent of removing wire paths from a particular area so that a greater number of timing critical circuits can be grouped closer together in that region. U.S. Pat. No. 6,192,508, "Method For Logic Optimization For Improving Timing and Congestion During Placement in Integrated Circuit Design", discusses the use of logic optimization to potentially relieve congestion through subsequent placement. The logic optimization techniques are applied to congested circuits in general, there is no assurance that the logic optimization on a specific circuit will give placement the flexibility to move that circuit out of its congested region without impacting timing.

Although in general a good approximation, the congestion metrics used by placement tools may not always accurately correspond to the wireability in a particular region as the actual wiring blockage map typically is not used in estimating the congestion. Additionally, it is common to switch to fatter than standard width wires on nets when iterating towards timing closure, thus taking up more wiring tracks. This impact on congestion is not fully known at the time of chip placement. Hence, it is possible to wind up with an area of wiring congestion during actual routing even if placement congestion estimates would not have predicted it.

The idea presented here is a method for identifying those wire routes which can be buffered and removed from a region of wiring congestion without inducing negative timing slacks. The added buffers and associated wire routes can then be moved from the congestion region without perturbation to the rest of the design.

SUMMARY OF THE INVENTION

The invention provides a method for identifying wire routes within a region of wiring congestion which have the capability to be routed outside of that region by the insertion of buffers without inducing negative timing slacks.

This is achieved by first identifying the inverter and buffer circuits with strong drive strength placed in the area of wiring congestion. The nets connecting to these circuits are then identified. For each of these nets, the circuit types and placement locations connecting to the net are then identified. This information is input to a program which for each net checks:

1. If the net has a single sink.
2. If both the source and the sink of the net are either inverters or buffers with strong drive strength.
3. If the locations of the two circuits connected by the net create a path through the congestion region.

If all of the above conditions are true, the net is reported.

A program is then used to correlate each net reported to its most negative slack. This slack is compared against a value which represents the delay of an inverter pair driving the wire lengths necessary to reach a location outside the wiring congestion region. If the slack is greater than this value, the net is buffered with an inverter pair placed such that the wire route no longer cuts through the region of wiring congestion.

In comparison to the ideas described above, the solution presented here is meant to be applied to a specific area of wiring congestion determined post routing. As previously discussed, the determination of congestion estimates during placement are not always an accurate reflection of the actual wireability. Additionally, design changes made during the process of iterating towards timing closure can lead to increased congestion in an area due to larger circuits and wider wires being required, negating the effort placement programs may have made to reduce congestion. As opposed to a general solution, this method is intended to address a specific area based on actual wiring and the actual timing delay required to remove a wire route from that area. This has the further advantage of limiting the design change to only those paths which can be removed from the congestion area without creating negative timing slacks, hence alleviating any change to circuits that have previously been optimized either manually or by automated processes and minimizing the design churn necessary for timing and wiring closure.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
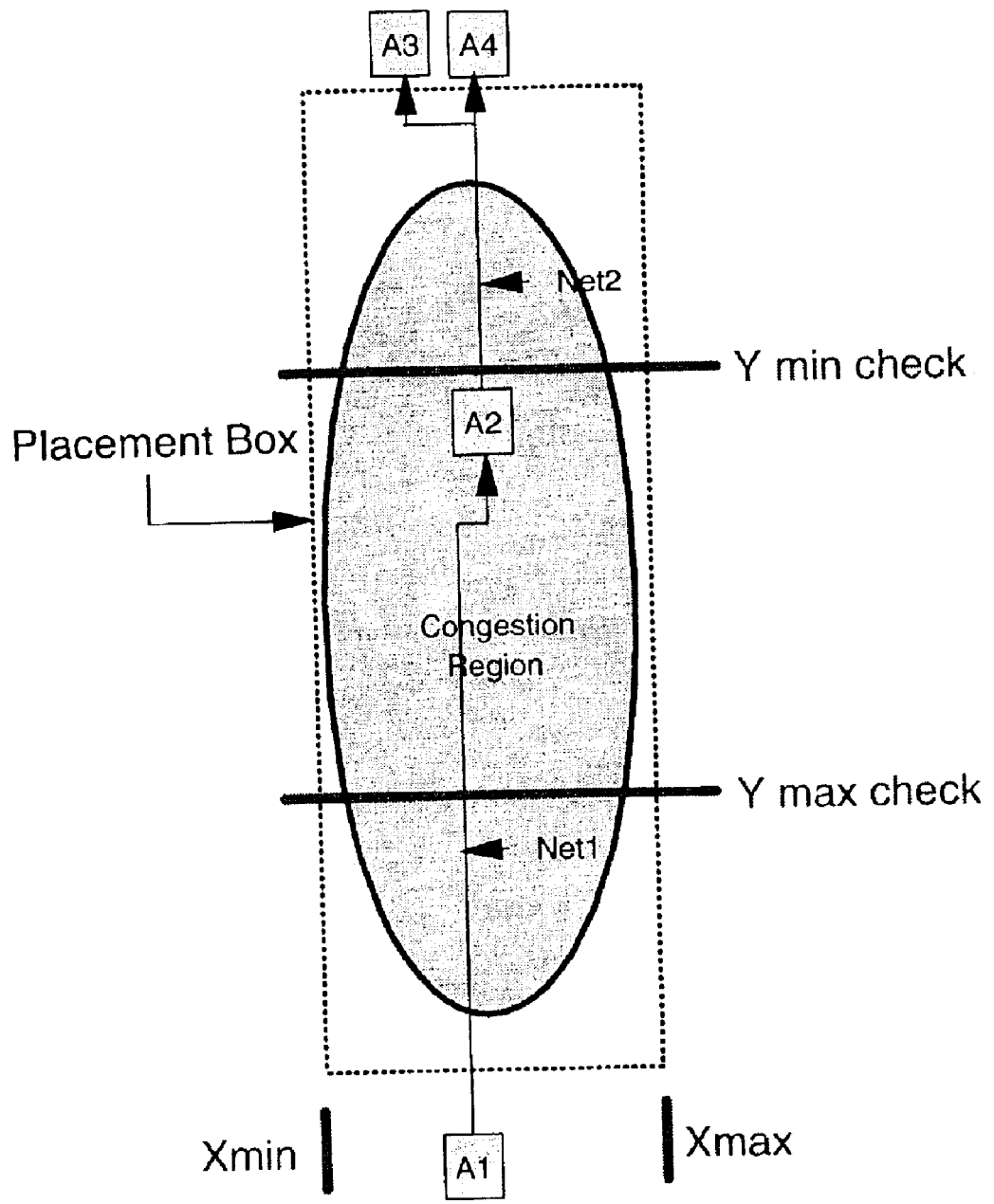
FIG. 1 illustrates a congestion region along with defined placement box. It also includes a circuit and net wire route to aid in the description of some of the process steps.
Figure 4:
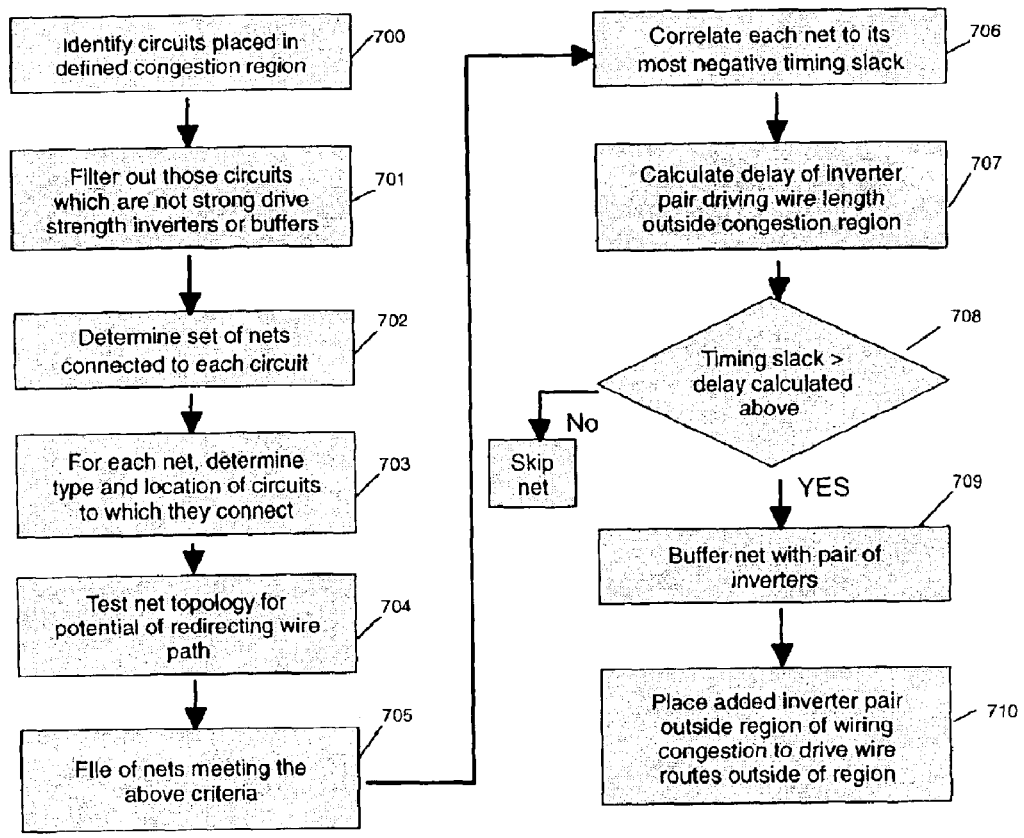
FIG. 4 is a flow diagram of the process steps.

A region of wiring congestion is defined, typically by review of wiring congestion maps in conjunction with the identification of non-steiner wiring routes. FIG. 4 is a flow diagram highliting the process steps. At step 700, a placement box is defined that encompasses the wiring congestion region and extends marginally beyond it on either side in the direction of the most severe wiring congestion (X vs. Y). This is depicted in FIG. 1 by the dashed line marked Placement Box and the red oval labeled Congestion Region. The placement box is extended slightly beyond the region of wiring congestion in the Y direction, the assumption in this example being that the direction of the most severe wiring congestion is in the Y direction. A program is then used to report all circuits placed within the placement box boundary. At step 701, these circuits are compared against a set of defined inverter and buffer circuit types of high drive strength. Those circuits not part of the set are filtered out. The rational for keeping only inverters and buffers with high drive strength is that they have the capability to drive a wire outside the congestion region. In addition, they are also the most likely circuits to be driving a long wire length through the region. In FIG. 1, consider circuit A2 to be a buffer with high drive strength. As it is placed within the placement box, it will be reported at this step.

Next, at step 702, a program is used to find the nets connected to each of the reported circuits. In FIG. 1, this would be nets Net1 and Net2 corresponding to circuit A2. The set of nets connected to the previously reported list of circuits is then input to a program at step 703 which outputs the circuit type and placement location of each circuit connected to a particular net. For Net2, the output would have Net2 corresponded to the circuit types and placement locations of circuits A2, A3, and A4. At step 704, this output is then input to a program which checks each net against the following conditions:

1. The net only has one sink. This ensures that any inverter pair added to buffer the net will only have to drive a distance half the width of the congestion region if placed on the side closest to the sink.
2. Both the source and sink are strong inverter or buffer circuits. The source having strong drive capability is necessary to drive a wire outside the congestion region. The sink being a strong drive circuit makes it more likely that it is driving circuits a fair distance away and has potential to be moved out of the region without adding length to its net once an inverter pair is added to the path.
3. The locations of the circuits connected to the net create a path through the congestion region. For the example in FIG. 1, where Y wiring direction is a concern, this means checking the X locations of the circuits to make sure they fall within Xmin and Xmax. If this is true, the maximum Y placement location of the circuits is checked to see if it is greater than the Y max check value and the minimum Y placement location of the circuits is checked to see if it less than the Y min check value. If these conditions are met, a significant portion of the net travels through the congestion region if routed in a steiner path. For Net1 in FIG. 1, this means checking that the X placement locations of circuits A1 and A2 are within Xmin and Xmax, that the Y location of A1 is less than the Y min check value and the Y location of A2 is greater than the Ymax check value.

Figure 2:
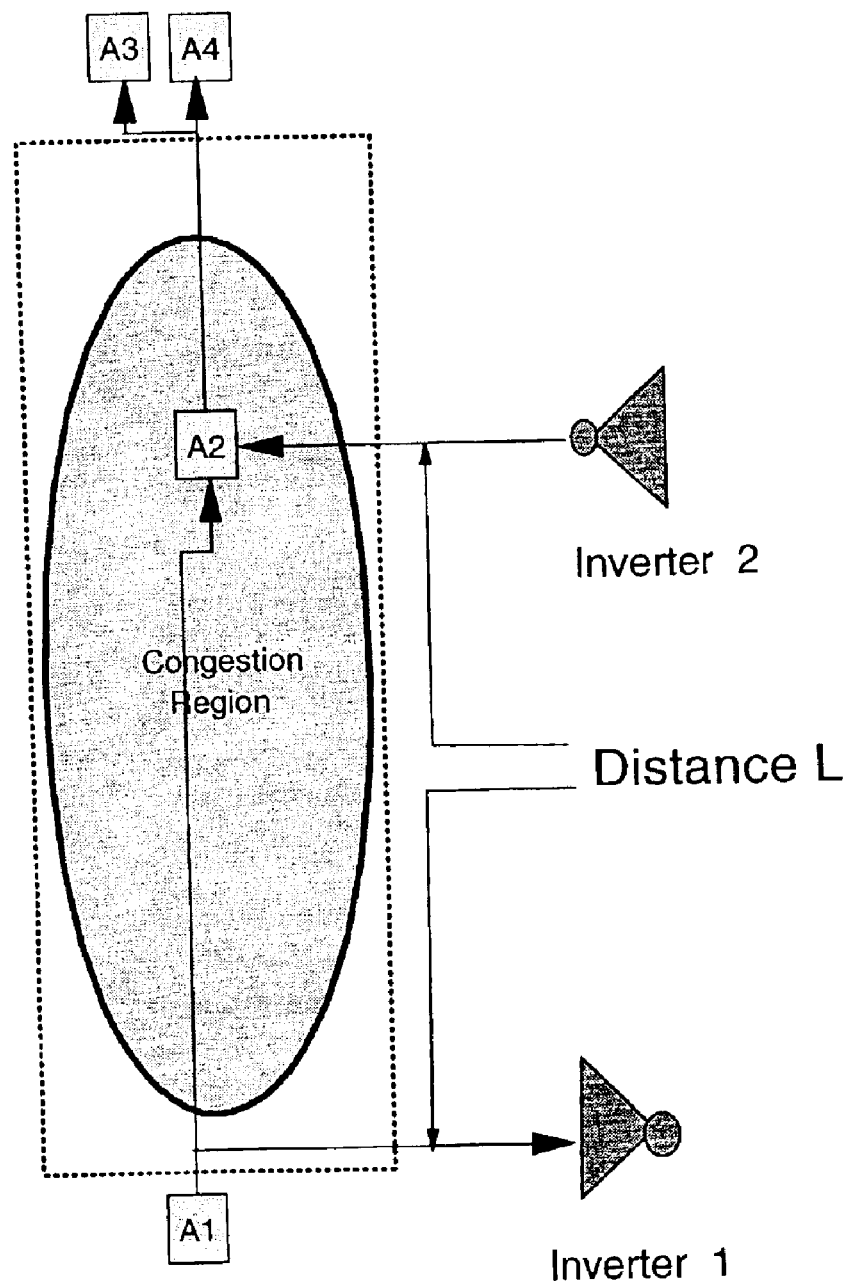
FIG. 2 is used to aid in the description of the calculation of the timing value chosen net slacks will be compared against.
Figure 3:
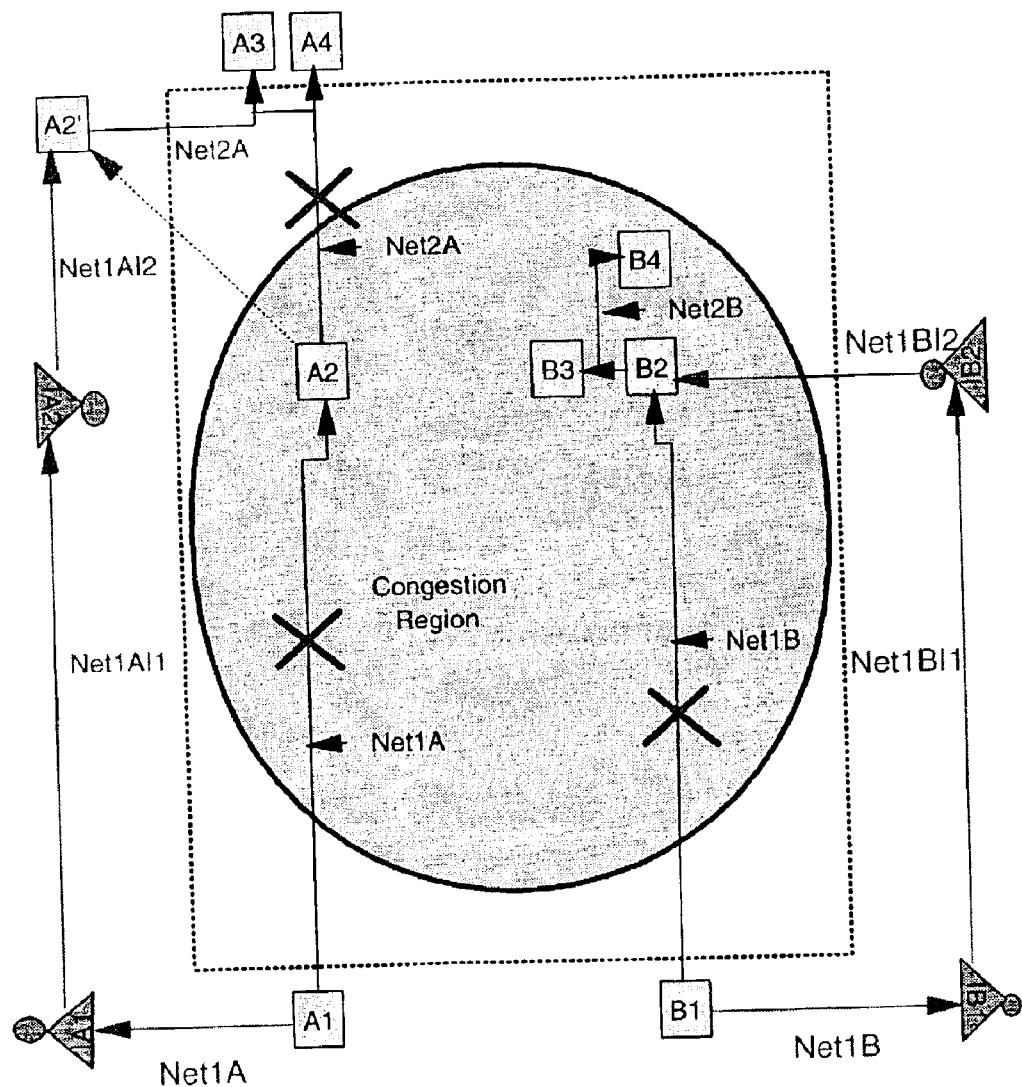
FIG. 3 illustrates wire routes pre and post buffer insertion and placement.

The set of nets which meet the above criteria are reported at step 705. At step 706, a program is used to correlate each of these nets to their most negative slacks as reported in the comprehensive timing report. A value representing the added delay created by adding an inverter pair placed outside the congestion region is calculated at step 707. In FIG. 2, this additional delay is roughly the delay of inverter 1 and 2 driving a wire length L plus twice the time of flight due to the wire length L. Although inverter 1 actually would drive the distance from A1 to A2 the assumption made is:

Delay of $A1$ driving length $A1$ to $A2$+Delay of inverter 1 driving length $L$=Delay of $A1$ driving length $L$+Delay of inverter 1 driving length $A1$ to $A2$ Step 708 compares the timing slack for a net against the calculated delay value of step 707. If the slack for a net is greater than the value representing the additional delay, the design netlist is updated at step 709 such that the net is buffered with an inverter pair. At step 710, the added inverters are placed outside the congestion region in a manner as to force the wire routes out of the congestion region. An example of this is shown in FIG. 3. For the path from A1 to A2, in the left half of the congestion region, net Net1 A now drives an inverter placed directly to the left of the region. The second inverter is placed at roughly the same Y location as circuit A2 and the same X location as the first inverter, the intent being to keep the distance between the inverters no more than the original distance between A1 and A2. In the case of this path, there is also leverage to move circuit A2 out of the congestion region without increasing delay. This is represented by the dashed line to circuit A2' in FIG. 3. As long as the X difference between A2 and A2' equals the Y difference between A2 and A2', there is no additional wire delay induced on nets Net1AI2 or Net2A. In this case, wiring routes for both nets Net1A and Net2A have been removed from the congestion region without segments for any other net being added or any negative timing slacks induced. For the path from B1 to B2, in the right side of the region, the inverter pair is placed to the right side of the congestion region in a manner similar to that just described for the A1 to A2 path. In this case, although there is no leverage to move circuit B2 without increasing the net length of Net2B or Net1BI2, a long run of vertical Net1B wire is still removed from the region at the expense of a short horizontal run on Net1BI2.

By using this process to identify and remove the wire routes of non critical timing paths from the wiring congestion region, wire tracks are freed up within the region so that the nets of timing critical paths are more likely to route in a steiner path, leading to reduced delay and improved timing.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for identifying, in a VLSI chip design, wire routes within a region of wiring congestion that have the necessary drive strength and net topology to be routed around that region, comprising the steps of
   (a) identifying all the circuits placed within the congestion region and filtering out all but the inverters and buffers with high drive strength; and (b) identifying nets connected to said circuits which have a single sink of high drive strength; and after determining identified nets which have adequate timing slack to be buffered and routed around the region of congestion, subsequently removing or substantially reducing the length of the route within the region; and (c) for each of said nets, determining if its circuit connections form a route through the congestion region.

2. The method as in claim 1, in which step (a) comprises determining those circuits placed within the region of wiring congestion and comparing them against a set of defined circuit types.

3. The method as in claim 1, in which step (b) comprises determining the nets connected to said circuits, further determining the circuits attached to each of the said nets, and testing that each net has a single sink and that both source and sink circuit are a subset of defined high strength circuit types.

4. The method as in claim 1, in which step (c) comprises testing the Xmin, Ymin, Xmax, and Ymax of the circuit placement locations against the borders of the congestion region to determine in the connection route is within or through the region.

5. The method of claim 1, wherein said nets are correlated to their most negative timing slack as determined from the timing reports.

6. The method of claim 1, wherein the delay of an inverter pair, each driving the wire length necessary to escape the congestion region, is calculated and used to represent the additional path delay of buffering a net to route outside the region.

7. The method of claim 6, wherein the timing slack of said nets are compared against the value determined and those nets with greater timing slack than the value are reported.

8. The method of claim 1, further comprising the step of modifying the design netlist such that the identified nets are buffered with an inverter pair.

9. The method of claim 8, further comprising the step of placing the added inverters outside the region of wiring congestion such that the wire routes are driven outside the region.

* * * * *